(12) United States Patent
Yu et al.

(10) Patent No.: US 8,698,306 B2
(45) Date of Patent: Apr. 15, 2014

(54) SUBSTRATE CONTACT OPENING

(75) Inventors: Chen-Hua Yu, Hsin-Chu (TW); Jiun Yi Wu, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 756 days.

(21) Appl. No.: 12/784,298

(22) Filed: May 20, 2010

(65) Prior Publication Data

US 2011/0285012 A1 Nov. 24, 2011

(51) Int. Cl.
*H01L 23/48* (2006.01)
*H01L 23/52* (2006.01)
*H01L 29/40* (2006.01)

(52) U.S. Cl.
USPC ..... 257/737; 257/738; 257/780; 257/E23.068

(58) Field of Classification Search
None
See application file for complete search history.

(56) References Cited

U.S. PATENT DOCUMENTS

| | | | |
|---|---|---|---|
| 5,258,648 A | 11/1993 | Lin | |
| 5,659,187 A | 8/1997 | Legoues et al. | |
| 6,016,013 A | 1/2000 | Baba | |
| 6,050,832 A | 4/2000 | Lee et al. | |
| 6,075,290 A | 6/2000 | Schaefer et al. | |
| 6,124,546 A | 9/2000 | Hayward et al. | |
| 6,224,690 B1 | 5/2001 | Andricacos et al. | |
| 6,335,491 B1 | 1/2002 | Alagaratnam et al. | |
| 6,596,621 B1 | 7/2003 | Copeland et al. | |
| 6,642,079 B1 | 11/2003 | Liu et al. | |
| 6,759,318 B1 | 7/2004 | Chang | |
| 6,812,578 B2 | 11/2004 | Kim et al. | |
| 6,833,285 B1 | 12/2004 | Ahn et al. | |
| 6,879,041 B2 | 4/2005 | Yamamoto et al. | |
| 6,919,137 B2 | 7/2005 | Kawashima et al. | |
| 7,233,074 B2 | 6/2007 | Ano | |
| 7,253,364 B2 | 8/2007 | Tang et al. | |
| 7,632,719 B2 | 12/2009 | Choi et al. | |
| 7,659,632 B2 | 2/2010 | Tsao et al. | |
| 7,834,449 B2 | 11/2010 | Kaufmann et al. | |
| 2002/0096764 A1 | 7/2002 | Huang | |
| 2006/0175699 A1 | 8/2006 | Lee | |
| 2008/0230901 A1 | 9/2008 | Duchesne et al. | |
| 2008/0246138 A1 | 10/2008 | Gerber et al. | |
| 2009/0042344 A1 | 2/2009 | Ye et al. | |

FOREIGN PATENT DOCUMENTS

| | | |
|---|---|---|
| JP | 2002-319588 | 10/2002 |
| KR | 10-2008-0097131 | 11/2008 |
| KR | 10-2009-0114675 | 11/2009 |

*Primary Examiner* — Thien F Tran
(74) *Attorney, Agent, or Firm* — Slater & Matsil, L.L.P.

(57) ABSTRACT

An under-bump metallization (UBM) structure for a substrate, such as an organic substrate, a ceramic substrate, a silicon or glass interposer, a high density interconnect, a printed circuit board, or the like, is provided. A buffer layer is formed over a contact pad on the substrate such that at least a portion of the contact pad is exposed. A conductor pad is formed within the opening and extends over at least a portion of the buffer layer. The conductor pad may have a uniform thickness and/or a non-planar surface. The substrate may be attached to another substrate and/or a die.

20 Claims, 3 Drawing Sheets

SUBSTRATE CONTACT OPENING

TECHNICAL FIELD

This disclosure relates generally to semiconductor devices and, more particularly, to substrate contact openings.

BACKGROUND

Since the invention of the integrated circuit (IC), the semiconductor industry has experienced continued rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

The past few decades have also seen many shifts in semiconductor packaging that have impacted the entire semiconductor industry. The introduction of surface-mount technology (SMT) and ball grid array (BGA) packages were generally important steps for high-throughput assembly of a wide variety of IC devices, while at the same time allowing for reduction of the pad pitch on the printed circuit board (PCB). Conventionally packaged ICs have a structure basically interconnected by fine gold wire between metal pads on the die and electrodes spreading out of molded resin packages. On the other hand, some BGA packages rely on bumps of solder to provide an electrical connection between contacts on the die and contacts on a packaging substrate, such as a silicon interposer, an organic substrate, a ceramic substrate, or the like, and rely on balls of solder to make an electrical connection between contacts on the packaging substrate and a PCB. Similarly, some chip size packaging (CSP) packages rely on balls of solder to make an electrical connection directly between contacts on the die and a PCB, another die/wafer, or the like. These techniques may also be used to interconnect multiple dies and/or wafers. The various layers making up these interconnections typically have different coefficients of thermal expansion (CTEs). As a result, a relatively large stress may be exhibited on the joint area, which often causes cracks to form.

SUMMARY

An under-bump metallization (UBM) structure for a substrate, such as an organic substrate, a ceramic substrate, a silicon or glass interposer, a high density interconnect, a printed circuit board, or the like, is provided. A buffer layer is formed over a contact pad on the substrate such that at least a portion of the contact pad is exposed. A conductor pad is formed within an opening and extends over at least a portion of the buffer layer. The conductor pad may have a uniform thickness and/or a non-planar surface. The substrate may be attached to another substrate and/or a die.

In another embodiment, an additional buffer layer may be formed and patterned over the conductor pad such that at least a portion of the conductor pad is exposed. Thereafter, an additional conductor pad may be formed overlying at least a portion of the additional buffer layer and in contact with the underlying conductor pad.

Other embodiments are disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION

Figure 1:
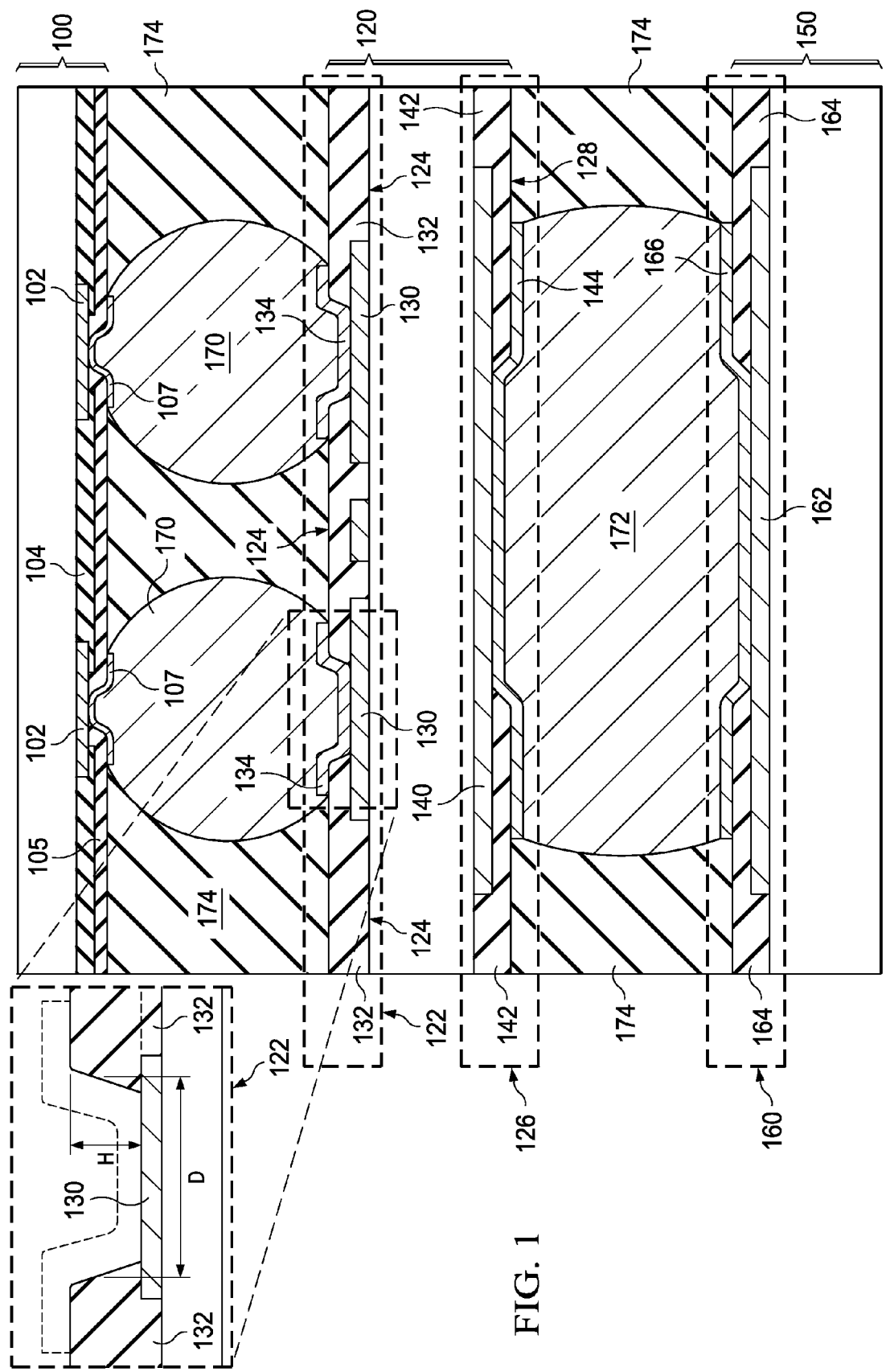
FIG. 1 is a cross-sectional view of contact structures that may be used to provide an electrical connection to a substrate in accordance with an embodiment.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Embodiments described herein relate to the use of under-bump metallization (UBM) for use with semiconductor devices. As will be discussed below, embodiments are disclosed that utilize a UBM structure on a substrate for the purpose of attaching one substrate to another substrate, wherein each substrate may be a packaging substrate, interposer, printed circuit board, or the like. Other embodiments may be used to electrically couple one or more dies to a substrate, which in turn may be electrically coupled to another substrate. Embodiments may be used in, for example, wafer level chip scale packaging (WLCSP) processes as well. Throughout the various views and illustrative embodiments, like reference numerals are used to designate like elements.

FIG. 1 illustrates a cross section of a portion of three substrates interconnected in accordance with an embodiment. A first substrate 100 may represent one or more dies having electrical circuitry thereon. The first substrate 100 may comprise any suitable substrate, such as bulk silicon, doped or undoped, or an active layer of a semiconductor-on-insulator (SOI) substrate, or the like. The electrical circuitry included on the first substrate 100 may be any type of circuitry suitable for a particular application. For example, the electrical circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

The first substrate 100 further includes external contacts 102 for providing an external electrical connection to the electrical circuitry formed thereon. A first passivation layer 104 is patterned to provide an opening over the external contacts 102 and to protect the underlying layers from various environmental contaminants. The upper dielectric layer of the first substrate 100 is subject to oxidation when exposed to the environment, and as a result, the first passivation layer 104 is formed over the uppermost dielectric layer. Thereafter, first conductive pads 106 are formed and patterned over the first passivation layer 104, such that at least a portion of the external contacts 102 are exposed. A second passivation layer 105, such as a polyimide layer (or other polymer material), is formed over the first passivation layer 104. Thereafter, an under bump metallization (UBM) layer 107 layer is formed and patterned over the second passivation layer 105 to provide an electrical connection to the external contacts 102. The UBM layer 107 may be formed of any suitable conductive materials, such as copper, tungsten, aluminum, silver, combinations thereof, or the like.

One of ordinary skill in the art will appreciate that the first substrate 100 may include many other features. For example, the first substrate 100 may include various metallization layers/dielectric layers, vias, contacts, through-substrate vias, passivation layers, liners, adhesion/barrier layers, redistribution layers, and/or the like.

Any suitable process may be used to form the structures discussed above and will not be discussed in greater detail herein. As one of ordinary skill in the art will realize, the above description provides a general description of the features of the embodiment and that numerous other features may be present. For example, other circuitry, liners, barrier layers, under-bump metallization configurations, and the like, may be present. The above description is meant only to provide a context for embodiments discussed herein and is not meant to limit the disclosure or the scope of any claims to those specific embodiments.

FIG. 1 also illustrates a second substrate 120 and a third substrate 150 in accordance with an embodiment. The second substrate 120 may be, for example, an organic substrate, a ceramic substrate, a silicon or glass interposer, a high-density interconnect, or the like. In an embodiment, the third substrate 150 is a PCB, but may include other types of substrates. In some embodiments, the second substrate 120 may include electrical elements, such as capacitors, resistors, signal distribution circuitry, and/or the like. These circuit elements may be active, passive, or a combination of active and passive elements.

The second substrate 120 has a bump stress buffer layer 122 along a die side 124 and a first ball stress buffer layer 126 along an external side 128. On the die side 124, the bump stress buffer layer 122 comprises bump contacts 130 with a bump buffer layer 132 formed thereover. The bump buffer layer 132 is patterned to provide openings over the bump contacts 130, thereby exposing at least a portion of the bump contacts 130. Bump conductor pads 134 are formed within the openings and overlapping at least a portion of the upper surface of the bump buffer layer 132.

Similarly, on the external side 128, the first ball stress buffer layer 126 comprises first ball contacts 140 with a first ball buffer layer 142 formed thereover. The second substrate 120 may have one or more vias, e.g., through-substrate vias (not shown), providing an electrical connection between respective ones of the first ball contacts 140 and the bump contacts 130. The first ball buffer layer 142 is patterned to provide openings over the first ball contacts 140, thereby exposing at least a portion of the first ball contacts 140. First ball conductor pads 144 are formed within the openings and overlapping at least a portion of the upper surface of the first ball buffer layer 142.

The third substrate 150 has a second ball stress buffer layer 160, which comprises a second ball contact 162 with a second ball buffer layer 164 formed thereover. The second ball buffer layer 164 is patterned to provide openings over the second ball contacts 162, thereby exposing at least a portion of the second ball contacts 162. Second ball conductor pads 166 are formed within the openings and overlapping at least a portion of the upper surface of the second ball buffer layer 164.

The bump buffer layer 132, the first ball buffer layer 142, and the second ball buffer layer 164, collectively referred to as the buffer layer, may be formed of a dielectric material, such as polymer, epoxy, polyimide, solder resist, photoresist, or the like, by any suitable method, such as spray coating, roller coating, printing, film lamination, or the like. In an embodiment, the buffer layer has a thickness of about 1 µm to about 30 µm. Thereafter, the buffer layer may be patterned using photolithography techniques by depositing a photoresist material, exposing the photoresist material to a pattern defining the openings, and developing the photoresist material to remove unwanted portions of the photoresist material, or by laser drilling to remove unwanted portions of the photoresist material. Once formed, the patterned photoresist material acts as an etch mask to pattern the buffer layer as illustrated in FIG. 1. It should be noted that the buffer layer itself may be formed of a photoresist material, such as a photo-sensitive polymer, in which case the etching step may be omitted, or the buffer layer itself may be formed by laser drilling.

As illustrated by the inset in FIG. 1, in an embodiment the opening in the buffer layer has a width D and a height H such that the aspect ratio defined by H/D has a range of about 0.1 to about 1. In another embodiment, the width D is about one-half of the height H. It should be noted that in an embodiment, the sidewalls of the opening may be slanted, and in this embodiment, the width D may be measured at the midpoint of the sidewalls of the opening.

The bump conductor pad 134, the first ball conductor pad 144, and the second ball conductor pad 166, collectively referred to as the conductor pad, may be formed by any suitable method, including physical vapor deposition (PVD), chemical vapor deposition (CVD), electrochemical deposition (ECD), molecular beam epitaxy (MBE), atomic layer deposition (ALD), electroplating, and the like. In an embodiment, the conductor pad is formed by depositing a conformal seed layer, which is a thin layer of a conductive material that aids in the formation of a thicker layer during subsequent processing steps. The seed layer may be formed by depositing a thin conductive layer, such as a thin layer of Ni, Au, Cu, Ti, Ta, TiN, TaN, other inert metals, combinations thereof, or the like, using CVD or PVD techniques. Thereafter, a patterned mask is formed and patterned over the seed layer that defines the lateral boundaries of the conductive pads. The patterned mask may be, for example, a patterned photoresist mask, hard mask, a combination thereof, or the like.

After the patterned mask is formed over the seed layer, an electroplating process may be performed to form the conductive pads to the desired thickness. The conductor pad may be a single layer, a composite layer, a stacked layer, or the like of one or more materials such as Ta, Ti, Ni, Au, Cu, Al, Pd, other inert metals, or the like. For example, in an embodiment the conductor pad comprises a layer of Cu about 5 µm in thickness and an overlying layer of Ni about 3 µm in thickness. In an embodiment, the conductor pad is formed of a material, e.g., Ni, Pd, Au, or the like that prevents or reduces the ability of copper diffusion into the conductive bump/ball. In an embodiment, the conductive pads have a non-planar surface and have a uniform thickness between less than about 10 µm. Once formed, the patterned mask and the remaining portions of the seed layer may be removed. In embodiments in which the patterned mask is formed from photoresist materials, the photoresist may be stripped by, for example, a chemical solution such as a mixture of ethyl lactate, anisole, methyl butyl acetate, amyl acetate, cresol novolak resin, and diazo photoactive compound (referred to as SPR9), or another stripping process. A cleaning process, such as a wet dip in a chemical solution of phosphoric acid ($H_3PO_4$) and hydrogen peroxide ($H_2O_2$), referred to as DPP, with 2% hydrofluoric (HF) acid, or another cleaning process, may be performed to remove exposed portions of the seed layer and any contaminants from the surface of the buffer layer. It should be noted that the above process may result in the bump conductor pad 134, the first ball conductor pad 144, and the second ball conductor pad 166 having rounded edges.

Conductive bumps 170 are used to provide an electrical connection between the first substrate 100 and the second substrate 120, and conductive balls 172 are used to provide an electrical connection between the second substrate 120 and the third substrate 150. In an embodiment, the second substrate 120 provides a matching coefficient of thermal expansion to the first substrate 100 in order to reduce the potential solder failure between the first substrate 100 and the second substrate 120 caused by thermal stresses, such as a silicon interposer. The second substrate 120 also provides adaptation between smaller contact pads with reduced pitch on the first substrate 100 and larger contact pads with increased pitch on the third substrate 150. To aid in the adaptation process and to allow different pin configurations between the first substrate 100 and the third substrate 150, the second substrate may include one or more redistribution layers (RDLs) on one or both of the die side 124 and the external side 128. The conductive bumps 170 and the conductive balls 172 may be lead free bumps, eutectic bumps, Cu post, or the like, and may comprise a homogeneous material property.

Optionally, an underfill 174 may be provided between the first substrate 100 and the second substrate 120 and between the second substrate 120 and the third substrate 150 to provide more reliable electrical connection and protect the solder bumps/balls connecting the first substrate 100 to the second substrate 120 and connecting the second substrate 120 to the third substrate 150, respectively, from external contaminations, as appreciated by those skilled in the art.

Figure 2A:
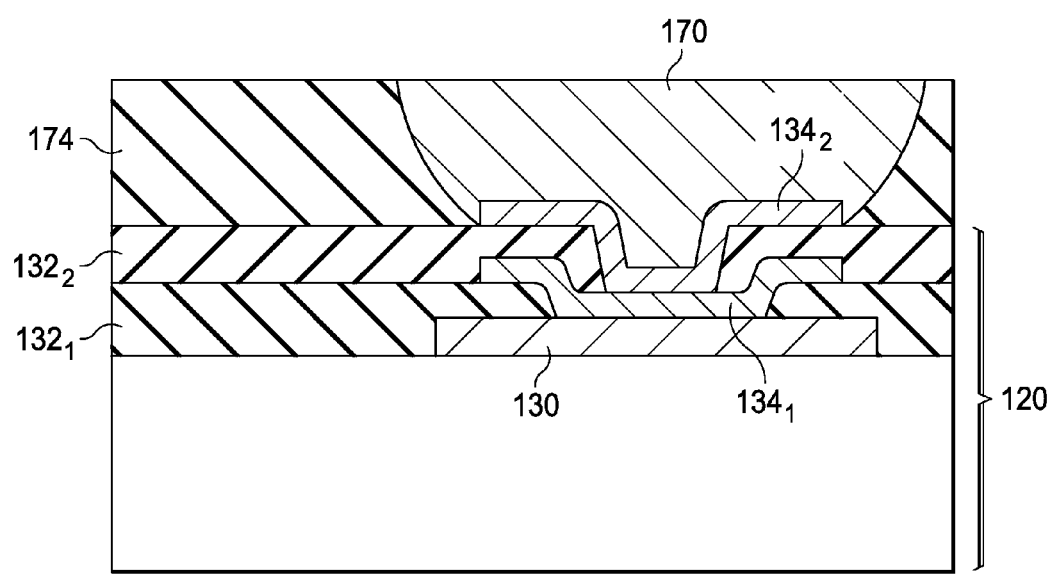
FIGS. 2A and 2B are cross-sectional views of contact structures that may be used to provide an electrical connection to a substrate in accordance with another embodiment.
Figure 2B:
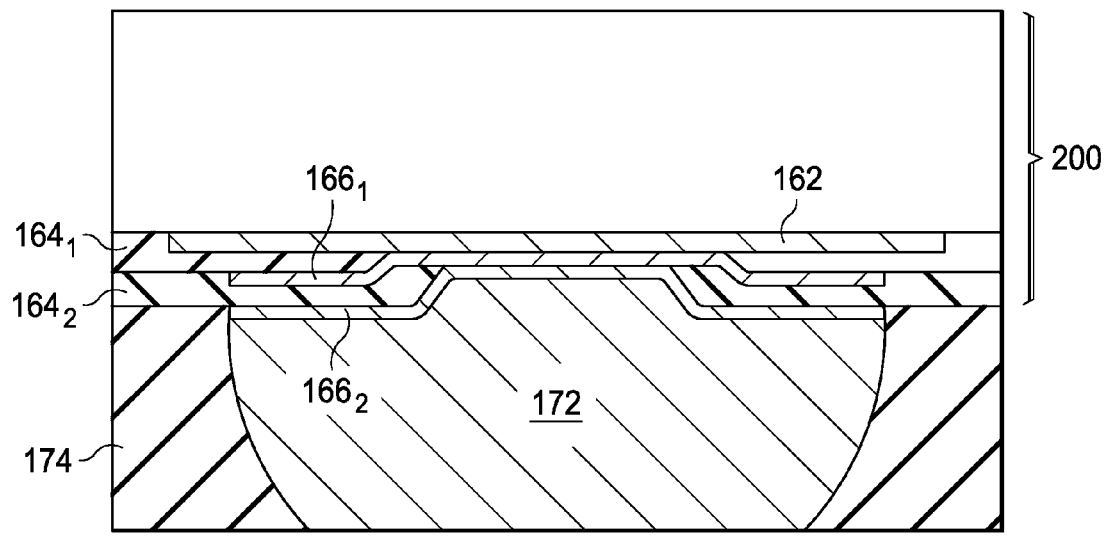

FIGS. 2A and 2B illustrate a bump connection and a ball connection, respectively, in accordance with other embodiments. The embodiment illustrated in FIG. 2A is similar to the embodiment illustrated in FIG. 1, except that the embodiment illustrated in FIG. 2A has two bump buffer layers ($132_1$, $132_2$) and two bump conductor pads ($134_1$, $134_2$), which may be formed in a similar manner using similar techniques and materials as described above with reference to the bump buffer layer 132 and the bump conductor pad 134, respectively.

Similarly, the embodiment illustrated in FIG. 2B is similar to the embodiment illustrated in FIG. 1, except that the embodiment illustrated in FIG. 2B has two ball buffer layers ($164_1$, $164_2$) and two ball conductor pads ($166_1$, $166_2$), which may be formed in a similar manner using similar techniques and materials as described above with reference to the ball buffer layer 164 and the ball conductor pad 166, respectively. It should be noted that substrate 200 of FIG. 2B represents either the second substrate 120 or the third substrate 150 of FIG. 1, such that the second substrate 120 and/or the third substrate 150 may have two ball buffer layers 164 and two ball conductor pads 166.

It should be appreciated that embodiments such as those illustrated herein allow for the conductive bumps and/or conductive balls to have a homogeneous material property. In connections used in other devices, the conductive bumps and/or conductive balls were surrounded by multiple types of materials, such as a solder resist and an underfill material. In embodiments such as those discussed herein, however, the conductive bumps and/or conductive balls are only surrounded by a single type of material, e.g., the underfill material. As such, there is a single material property exerting stress on the conductive bumps and/or conductive balls. It has also been found that the thermal stress between the conductor pads and the conductive bumps/balls is less than it would be if the conductive bumps/balls interfaced directly with the solder resist as in other systems.

Figure 3:
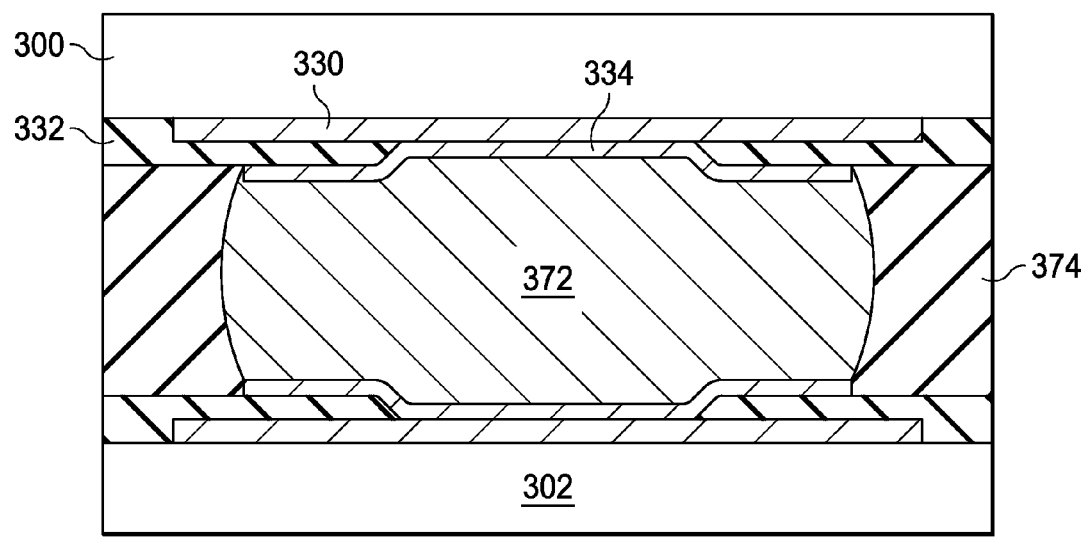
FIG. 3 is a cross-sectional view of a connection between a die and a printed circuit board in accordance with yet another embodiment.

FIG. 3 illustrates another embodiment, which may be used, for example, in the context of WLCSP. In this embodiment, a WLCSP die 300 is coupled directly to a PCB 302 by a conductive ball 372. The WLCSP die 300 has formed thereon a WLCSP ball buffer layer 332 patterned to expose underlying WLCSP ball contacts 330. A WLCSP ball conductor pad 334 is formed within the opening of the WLCSP ball buffer layer 332 and extends over a surface of the WLCSP ball buffer layer 332. The WLCSP ball contacts 330, the WLCSP ball buffer layer 332, and the WLCSP ball conductor pad 334 may be formed using similar processes and materials as the bump contacts 130, the bump buffer layer 132, and the bump conductor pad 134, respectively.

After the WLCSP processing has been completed, the WLCSP die 300 may be connected to the PCB 302 using, for example, conductive balls 372, which may be similar to the conductive balls 172 discussed above. An optional underfill 374, which may be similar to the underfill 174 discussed above, is also shown.

It should be noted that in this embodiment, the WLCSP die 300 is the die itself having the conductive ball 372 applied thereto in accordance with WLCSP processing techniques. As such, this embodiment utilizes the conductive bump/ball contact structure discussed above with reference to FIGS. 1-2b on the die in a WLCSP scheme as well as on the PCB 302. While some devices have in the past used conductive bump/ball structures similar to those discussed above on the die itself, the present embodiments, among other things, utilize the conductive bump/ball structures in a WLCSP scheme.

It has been found that embodiments such as those disclosed above may reduce the stress between the conductive bumps/balls and the second substrate and the third substrate, but also that using structures such as these on the second substrate or the third substrate may also reduce the stress in the first substrate itself, e.g., the silicon die. For example, simulation results indicate that an embodiment in which a silicon die is attached directly to a substrate, in which the substrate utilizes a conductor pad such as those disclosed above, may reduce the stress not only between the bump and the substrate, but also between the bump and the silicon die itself. In particular, a simulation comparing a connection between a substrate and a die wherein the substrate does not have a conductor pad structure as discussed above and a connection between a substrate and a die in which the substrate does have a conductor pad structure as discussed above, the stress in the areas of the interface between the bump and the die may be reduced at least as much as 32%.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor structure comprising:
   an integrated circuit die having a first substrate;
   a second substrate comprising a first contact pad, a first buffer layer over the first contact pad such that an opening in the first buffer layer exposes at least a portion of the first contact pad, and a first conductor pad in electrical contact with the first contact pad, the first conductor pad having a non-planar surface and being formed along sidewalls of the opening and extending over at least a portion of the first buffer layer; and
   a conductive material interposed between the first substrate and the second substrate, the conductive material being in direct contact with the first conductor pad.

2. The semiconductor structure of claim 1, wherein the first buffer layer comprises a polymer, an epoxy, a polyimide, a solder resist, or a photo-sensitive material.

3. The semiconductor structure of claim 1, further comprising a second buffer layer interposed between the first buffer layer and the first contact pad and a second conductor pad interposed between the first conductor pad and the first contact pad, the second conductor pad extending over a top surface of the second buffer layer.

4. The semiconductor structure of claim 3, wherein the second buffer layer comprises a polymer, an epoxy, a polyimide, a solder resist, or a photo-sensitive material.

5. The semiconductor structure of claim 1, wherein a thickness of the first conductor pad is less than about 10 µm.

6. The semiconductor structure of claim 1, wherein the first conductor pad comprises a composite film.

7. The semiconductor structure of claim 1, wherein the first conductor pad comprises Ta, Ti, Ni, Au, Cu, Al, or an inert metal.

8. The semiconductor structure of claim 1, wherein the second substrate comprises an organic substrate, a high density interconnect, a printed circuit board, or a silicon interposer.

9. A semiconductor structure comprising:
   a first substrate having a first side and a second side, at least one of the first side and the second side being formed to accept a connection to an integrated circuit die; and
   a bump stress buffer layer directly on and contacting the first side of the first substrate, the bump stress buffer layer comprising a first bump buffer layer overlying a first electrical contact, the first bump buffer layer having an opening over at least a portion of the first electrical contact, the bump stress buffer layer further comprising a plurality of first bump conductor pads, the first bump conductor pads having a uniform thickness and extending over a top surface of the first bump buffer layer.

10. The semiconductor structure of claim 9, further comprising a second substrate having electrical circuitry formed thereon, the second substrate being electrically connected to the first bump conductor pads of the first substrate using conductive bumps.

11. The semiconductor structure of claim 10, further comprising an underfill material interposed between the first substrate and the second substrate.

12. The semiconductor structure of claim 9, wherein the first bump buffer layer comprises a polymer, an epoxy, a polyimide, a solder resist, or a photo-sensitive material.

13. The semiconductor structure of claim 9, further comprising a second bump buffer layer interposed between the first bump buffer layer and the first electrical contact and a second bump conductor pad interposed between the first bump conductor pad and the first electrical contact, the second bump conductor pad extending over a top surface of the second bump buffer layer.

14. The semiconductor structure of claim 13, wherein the second bump buffer layer comprises a polymer, an epoxy, a polyimide, a solder resist, or a photo-sensitive material.

15. The semiconductor structure of claim 9, wherein a thickness of the first bump conductor pad is less than about 10 µm.

16. A semiconductor structure comprising:
   a first substrate having a first side and a second side, at least one of the first side and the second side being formed to accept a connection to an integrated circuit die; and
   a bump stress buffer layer on the first side of the first substrate, the bump stress buffer layer comprising a first bump buffer layer overlying a first electrical contact, the first bump buffer layer having an opening over at least a portion of the first electrical contact, the bump stress buffer layer further comprising a plurality of first bump conductor pads, the first bump conductor pads having a uniform thickness and extending over a top surface of the first bump buffer layer and
   a ball stress buffer layer on the second side of the first substrate, the ball stress buffer layer comprising a ball buffer layer overlying a second electrical contact, the ball buffer layer having an opening over at least a portion of the second electrical contact, the ball stress buffer layer further comprising a ball conductor pad, the ball conductor pad having a uniform thickness and extending over a top surface of the ball buffer layer.

17. The semiconductor structure of claim 16, wherein the first bump buffer layer comprises a polymer, an epoxy, a polyimide, a solder resist, or a photo-sensitive material.

18. The semiconductor structure of claim 16, further comprising a second bump buffer layer interposed between the first bump buffer layer and the first electrical contact and a second bump conductor pad interposed between the first bump conductor pad and the first electrical contact, the second bump conductor pad extending over a top surface of the second bump buffer layer.

19. The semiconductor structure of claim 18, wherein the second bump buffer layer comprises a polymer, an epoxy, a polyimide, a solder resist, or a photo-sensitive material.

20. The semiconductor structure of claim 16, wherein a thickness of the first bump conductor pad is less than about 10 µm.

* * * * *